(12) United States Patent
Cunningham et al.

(10) Patent No.: US 9,013,927 B1
(45) Date of Patent: Apr. 21, 2015

(54) SECTOR-BASED REGULATION OF PROGRAM VOLTAGES FOR NON-VOLATILE MEMORY (NVM) SYSTEMS

(71) Applicants: Jeffrey C. Cunningham, Austin, TX (US); Ross S. Scouller, Austin, TX (US); Ronald J. Syzdek, Austin, TX (US)

(72) Inventors: Jeffrey C. Cunningham, Austin, TX (US); Ross S. Scouller, Austin, TX (US); Ronald J. Syzdek, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/050,962

(22) Filed: Oct. 10, 2013

(51) Int. Cl.
*G11C 16/06* (2006.01)
*G11C 16/10* (2006.01)

(52) U.S. Cl.
CPC ....................................... *G11C 16/10* (2013.01)

(58) Field of Classification Search
USPC ................... 365/185.23, 185.18, 189.09, 226
See application file for complete search history.

(56) References Cited

U.S. PATENT DOCUMENTS

| | | | |
|---|---|---|---|
| 5,430,674 A | 7/1995 | Javanifard | |
| 5,537,350 A | 7/1996 | Larsen et al. | |
| 5,726,944 A | 3/1998 | Pelley, III et al. | |
| 5,907,700 A | 5/1999 | Talreja et al. | |
| 7,952,937 B2 * | 5/2011 | Bode | 365/185.23 |
| 2001/0011886 A1 | 8/2001 | Kobayashi | |
| 2002/0097627 A1 | 7/2002 | Sacco et al. | |
| 2003/0151949 A1 | 8/2003 | Micheloni et al. | |
| 2013/0265828 A1 | 10/2013 | Cunningham et al. | |

OTHER PUBLICATIONS

Cunningham et al., "Digital Control for Regulation of Program Voltages for Non-Volatile Memory (NVM) Systems", FRSC:029; U.S. Appl. No. 14/185,454, filed Feb. 20, 2014, 22 pgs.

* cited by examiner

*Primary Examiner* — David Lam
(74) *Attorney, Agent, or Firm* — Egan, Peterman & Enders LLP.

(57) ABSTRACT

Methods and systems are disclosed for sector-based regulation of program voltages for non-volatile memory (NVM) systems. The disclosed embodiments regulate program voltages for NVM cells based upon feedback signals generated from sector return voltages that are associated with program voltage drivers that are driving program voltages to NVM cells within selected sectors an NVM array. As such, drops in program voltage levels due to IR (current-resistance) voltage losses in program voltage distribution lines are effectively addressed. This sector-based regulation of the program voltage effectively maintains the desired program voltage at the cells being programmed regardless of the sector being accessed for programming and the number of cells being programmed. Sector return voltages can also be used along with local program voltages to provide two-step feedback regulation for the voltage generation circuitry. Test mode configurations can also be provided using test input and/or output pads.

20 Claims, 7 Drawing Sheets

SECTOR-BASED REGULATION OF PROGRAM VOLTAGES FOR NON-VOLATILE MEMORY (NVM) SYSTEMS

TECHNICAL FIELD

The technical field relates to generation and application of program voltages for arrays of non-volatile memory (NVM) cells within NVM systems.

BACKGROUND

Non-volatile memory (NVM) systems include arrays of NVM cells that are programmed using program bias voltages applied to program nodes. NVM systems can also be embedded within other integrated circuits, such as for example, microcontrollers and/or microprocessors. Many NVM systems, including embedded NVM systems, utilize smart program biasing and erase biasing where program/erase bias voltages are ramped, stepped and/or pulsed from a low voltage bias level to a higher voltage bias level in order to minimize stress to cells within the NVM array.

FIG. 1 (Prior Art) is a block diagram of an embodiment 100 for regulating a program voltage ($V_{PRG}$) 108 that is used to program cells within an NVM array. Voltage pump circuitry 102 receives an enable signal (EN) 104, receives an oscillation input signal (OSC) 106, and generates a regulated program voltage ($V_{PRG}$) 108 that is applied to program drivers 110 for an NVM array. The regulation of the program voltage ($V_{PRG}$) 108 is provided through a voltage feedback signal ($V_{FB}$) 116 that is received by the voltage pump circuitry 102. The voltage feedback signal ($V_{FB}$) 116 is generated by a comparator 114 that compares the generated program voltage ($V_{PRG}$) 108 to a reference voltage ($V_{REF}$) 112. In operation, the voltage pump circuitry 102 uses the voltage feedback signal ($V_{FB}$) 116 to keep the program voltage ($V_{PRG}$) 108 at a selected voltage level as set by the reference voltage ($V_{REF}$) 112. The reference voltage ($V_{REF}$) 112 is changed if different voltage levels are desired. The program voltage ($V_{PRG}$) 108, however, can be affected by IR (current-resistance) losses when used to feed program voltage drivers through relatively long distribution lines.

FIG. 2 (Prior Art) is a block diagram of an embodiment 200 for an NVM cell array 206 that receives generated program voltages. For embodiment 200, the NVM cell array 206 includes eight sectors (e.g., Sector0, Sector1 . . . Sector7) of split-gate thin film storage (SGTFS) NVM cells, which include control gates, select gates, sources, and drains. Each sector has a control gate driver (CGDrv) that applies a high voltage (HV) output signal from the program voltage generation circuitry 202 to cells within the sector that have been selected for programming. A distribution line 208 feeds the HV output signal to control gate drivers. Each sector also has a source gate driver (SRCDrv) that applies a medium voltage (MV) output signal (e.g., the program voltage ($V_{PRG}$) in FIG. 1) from the program voltage generation circuitry 202 to cells within the sector that have been selected for programming. A distribution line 210 feeds the MV output signal to the source gate drivers. As the source gate nodes are relatively low impedance nodes, a high current will travel along the distribution line 210. Due to the different distances and potentially long distance 204 (e.g., 2.2 millimeters) that this current will travel along distribution line 210, for example to Sector7, different and potentially large IR (current-resistance) voltage drops will occur. As such, the voltages actually applied to the NVM cells through the source drivers can be less than the desired program voltage level. As the control gate nodes are relatively high impedance nodes, the IR voltage drop along the distribution line 208 is not significant.

FIG. 3 (Prior Art) is a block diagram of an embodiment 300 for variations in program pulse voltages due to IR voltage losses experienced in distributing program voltages to source drivers within an NVM array. The x-axis 304 represents time, and the y-axis 302 represents pulse voltage. For the embodiment 300, three program pulses are shown. Pulse voltage levels 306, 308, and 310 represent desired pulse voltage levels for pulses that ramp to 4.0 volts, 5.0 volts, and 6.0 volts, respectively. Actual voltage pulses 312, 314, and 316 do not reach the desired voltage levels due to IR voltage losses. For example, an IR voltage loss of about 0.1 volts can be experienced when the program voltage ($V_{PRG}$) 108 of FIG. 1 is used to drive source nodes for 72 cells at 1 milli-Amp (mA) through program voltage drivers located at the end of a voltage distribution line that is 2.2 millimeters (mm). It is noted that the sheet resistance for the distribution line, the sector selected, and the current level will affect this IR loss. It is also noted that the current level is determined by the number of cells selected for programming within the NVM array.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale FIG. 1 (Prior Art) is a block diagram of an embodiment for regulating a program voltage that is used to program cells within an NVM (non-volatile memory) array.

DETAILED DESCRIPTION

Methods and systems are disclosed for sector-based regulation of program voltages for non-volatile memory (NVM) systems. The disclosed embodiments regulate program voltages for NVM cells based upon feedback signals generated from sector return voltages that are associated with program voltage drivers that are driving program voltages to NVM cells within selected sectors for an NVM array. As such, drops in program voltage levels due to IR (current-resistance) voltage losses in program voltage distribution lines are effectively addressed. This sector-based regulation of the program voltage effectively maintains the desired program voltage at the cells being programmed regardless of the sector being accessed for programming and the number of cells being programmed. Sector return voltages can also be used along with local program voltages to provide two-step feedback regulation for the voltage generation circuitry. Different features and variations can be implemented, as desired, and related or modified systems and methods can be utilized, as well.

Advantageously, rather than rely solely upon feedback at the output of a voltage pump or other voltage generation circuitry, the disclosed embodiments utilize sector return voltages at sector boundaries to allow for consistent programming voltages regardless of the size and placement of the NVM array within an integrated circuit and regardless of the sector and number of bits selected to program. Sector return voltages are obtained from program voltage drivers within selected sectors for the NVM array so that sector specific feedback is provided to control generation of program voltages. As such, target voltage levels are maintained at the sector boundary regardless of IR (current-resistance) drops that occur along the distribution line for the program voltage. These target voltages are maintained regardless of the sector and/or the number of bits selected to be programmed. Further, for split-gate thin film storage (SGTFS) cells and related NVM arrays, the sector source drivers include a pass device and a return distribution line to provide a sector return voltage as feedback to the voltage generation circuitry. The return distribution line for the sector return voltage can be configured as a high impedance load so that IR drops for this sector return voltage would be negligible. Still further, during test mode operations, the sector return voltage can be provided to an external output pad, and an external program voltage can be provided as the program voltage to the NVM cells instead of the regulated program voltage. Other variations could also be implemented as desired.

Figure 1:
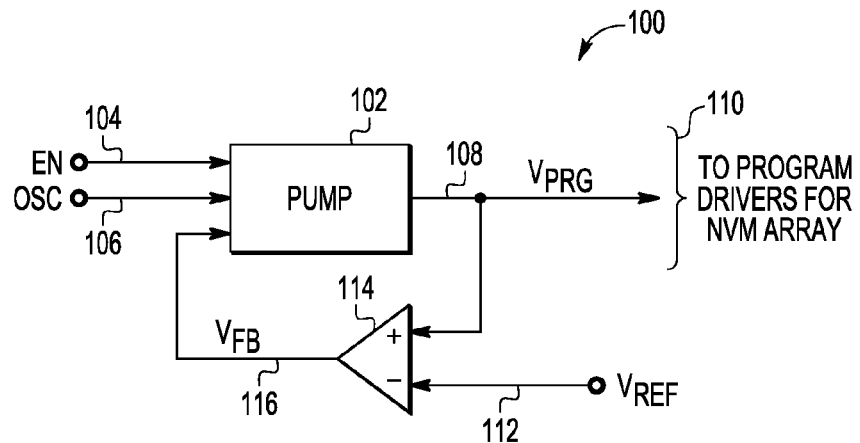
Figure 2:
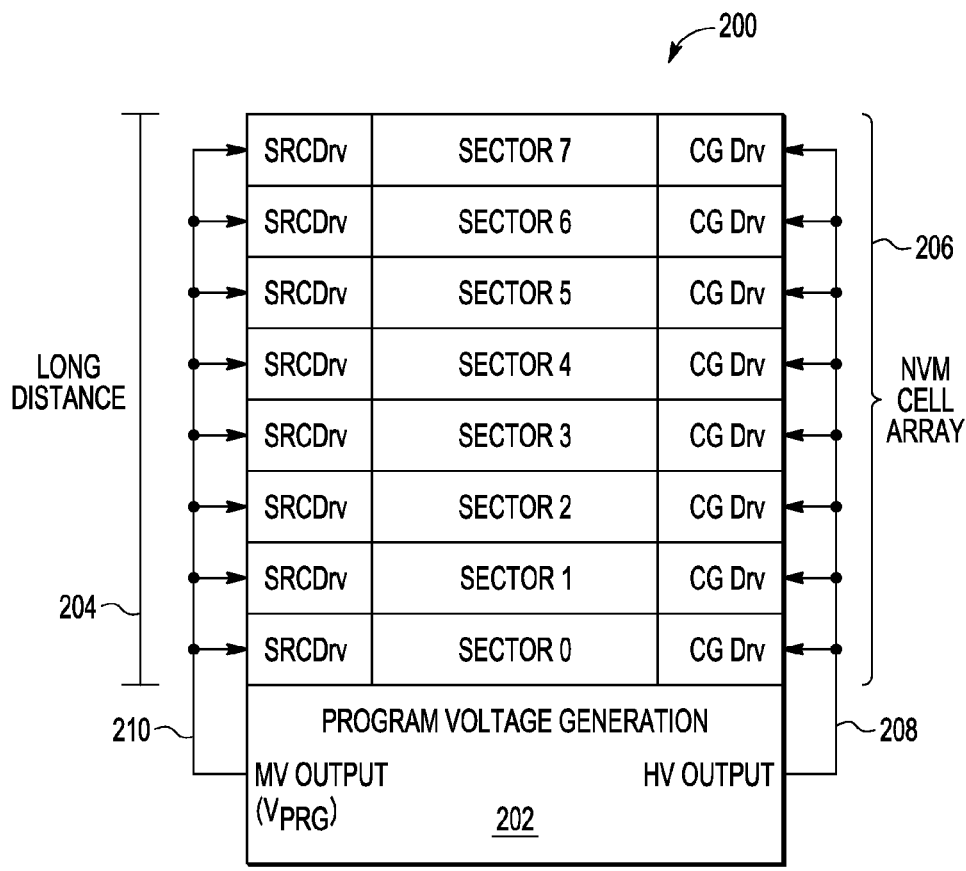
FIG. 2 (Prior Art) is a block diagram of an embodiment for an NVM cell array that receives generated program voltages.
Figure 4:
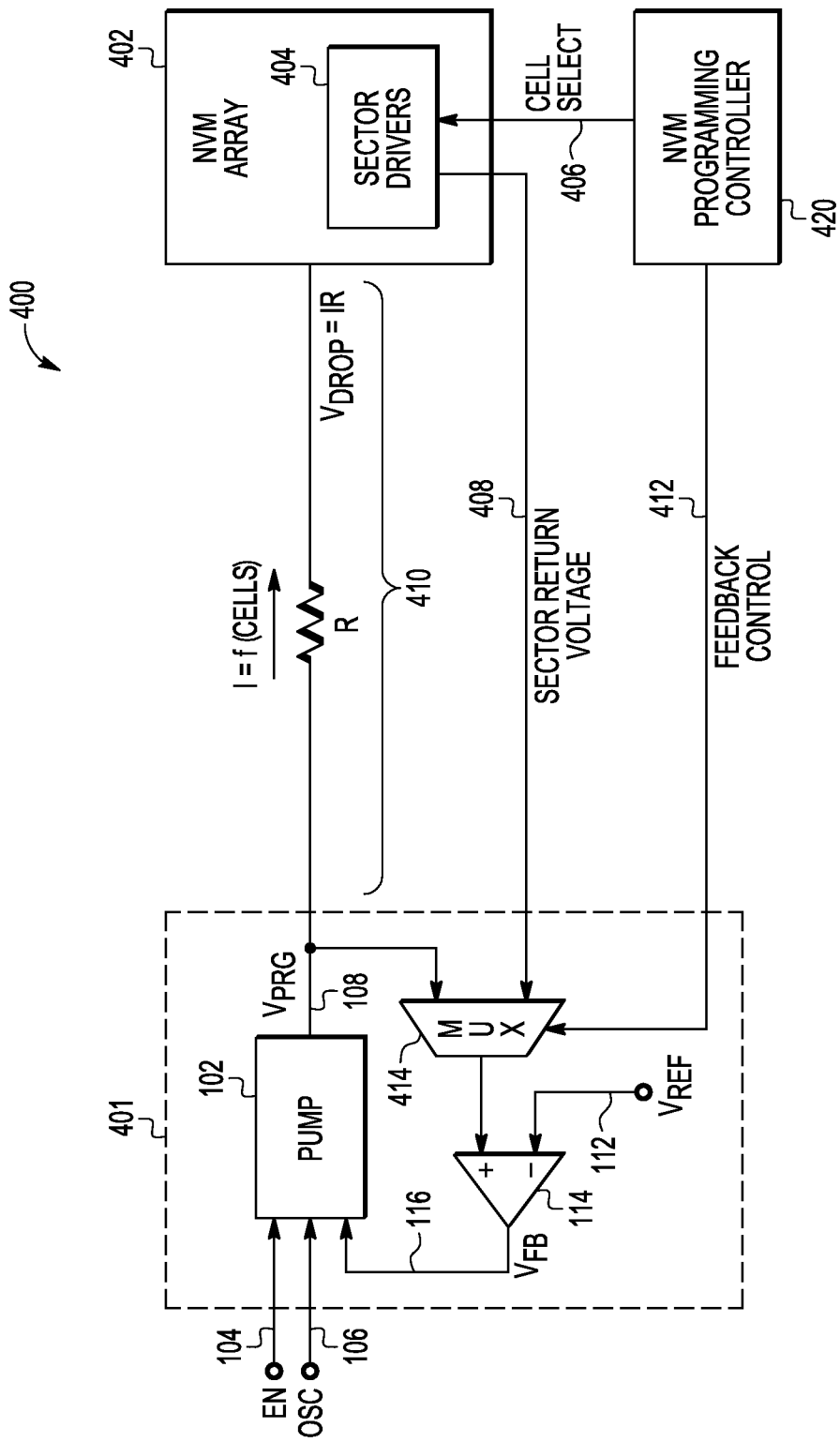
FIG. 4 is a block diagram of an embodiment for an NVM system that utilizes a sector return voltage as feedback to regulate the voltage pump circuitry.

FIG. 4 is a block diagram of an embodiment 400 for an NVM system that utilizes a sector return voltage 408 as feedback to regulate voltage generation circuitry 401. As with embodiment 100 of FIG. 1 (Prior Art), voltage generation circuitry 401 includes voltage pump circuitry 102 and comparator 114. The voltage pump circuitry 102 receives an enable signal (EN) 104 and an oscillation input signal (OSC) 106 and generates a regulated program voltage ($V_{PRG}$) 108. A voltage drop ($V_{DROP}$) for the program voltage ($V_{PRG}$) 108 will result due to an IR (current-resistance) voltage loss based upon the resistance (R) of the distribution line 410 and the current (I) flowing through the distribution line 410, which will be a function of the number of cells selected to be programmed (e.g., I=f(cells)). In contrast with embodiment 100 of FIG. 1 (Prior Art), a sector return voltage 408 is also used to regulate the program voltage ($V_{PRG}$) 108 output by the voltage pump circuitry 102. The sector return voltage 408 is provided by sector program voltage drivers 404 within the NVM cell array 402. For the embodiment 400 depicted, multiplexer (MUX) 414 receives as inputs both the sector return voltage 408 and the program voltage ($V_{PRG}$) 108. Based upon the feedback control signal 412, the multiplexer 414 provides the program voltage ($V_{PRG}$) 108 or the sector return voltage 408 to the comparator 114, which in turn provides the feedback signal ($V_{FB}$) 116 to the voltage pump circuitry 102. The reference voltage ($V_{REF}$) 112 for comparator 114 is changed if different target voltage levels are desired for the program voltage ($V_{PRG}$) 108, such as where a series of program voltage pulses have increasing larger voltage levels.

In operation, therefore, the voltage feedback signal ($V_{FB}$) 116 provided to the voltage pump circuitry 102 can be based upon the local output of the voltage pump circuitry 102 or can be based upon the sector return voltage 408. As such, the sector return voltage 408 can be selectively used to regulate the program voltage ($V_{PRG}$) 108 in addition to the program voltage ($V_{PRG}$) 108 itself. As described in more detail below, the sector return voltage 408 will depend upon the cells selected to be programmed within the NVM array 402 as determined by the cell select signal 406. By using the sector return voltage 408 obtained from the sector drivers 404 as feedback, embodiment 400 effectively compensates for the IR voltage loss due to the distribution line for the program voltage ($V_{PRG}$) 108. The voltage feedback ($V_{FB}$) 116 for embodiment 100 of FIG. 1 (Prior Art), which is based solely upon the local output of the voltage pump circuitry 102, does not address this IR voltage loss. It is noted that although likely less efficient, the multiplexer 414 could be removed, if desired, and the sector return voltage 408 could be provided directly to the comparator 114. As such, only the sector-based feedback would be used to regulate the voltage generation for the program voltage ($V_{PRG}$) 108.

It is further noted that NVM programming controller 420 can be configured to provide the cell select signal 406 and the feedback control signal 412. For one embodiment, the feedback control signal 412 can first be controlled by the NVM programming controller 420 such that the program voltage ($V_{PRG}$) 108 is initially selected and output by multiplexer 414 to the comparator 114. As such, the voltage feedback signal ($V_{FB}$) 116 is initially based upon the local output of the voltage pump circuitry 102 to provide an initial regulation of the program voltage ($V_{PRG}$) 108. The feedback control signal 412 can then be controlled by the NVM programming controller 420 such that the sector return voltage 408 is subsequently selected and output by multiplexer 414 to the comparator 114. As such, the voltage feedback signal ($V_{FB}$) 116 is subsequently based upon sector voltages returned by the sector program voltage drivers 404 being used to program selected NVM cells within the NVM array 402. As such, sector-based regulation of the program voltage ($V_{PRG}$) 108 is subsequently provided. Advantageously, this two step regulation of the program voltage ($V_{PRG}$) 108 allows both for initial local correction of the program voltage ($V_{PRG}$) 108 to account for voltage variations within the voltage pump circuitry 102 followed by subsequent sector-based correction of the program voltage ($V_{PRG}$) 108 to account for voltage drops due to IR voltage losses in the distribution line providing the program voltage ($V_{PRG}$) 108 to the sector drivers 404 that are being used to program the NVM cells selected for programming.

Figure 5:
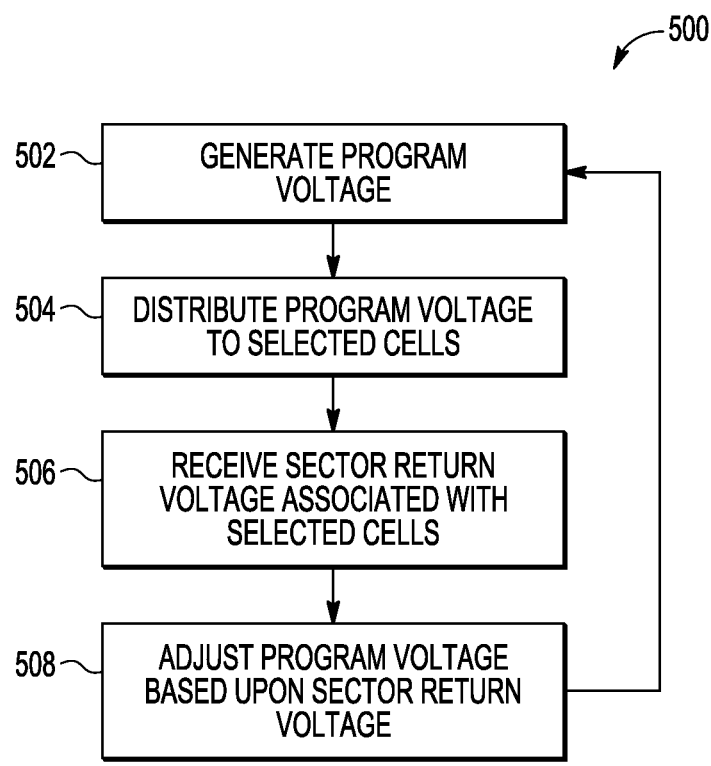
FIG. 5 is a process flow diagram of an embodiment for utilizing a sector return voltage to regulate a program voltage.

FIG. 5 is a process flow diagram of an embodiment 500 for utilizing a sector return voltage to regulate a program voltage. In block 502, a program voltage is generated using voltage generation circuitry, such as for example, voltage pump circuitry although other voltage generation circuitry could also be utilized. In block 504, the program voltage is distributed to the cells selected to be programmed. As described herein, depending upon the current level and the distribution distance, IR voltage losses will occur due to the distribution line used to provide the program voltage to the sector drivers for the cells selected to be programmed. In block 506, a sector return voltage associated with the selected cells is received as feedback. In block 508, the program voltage is adjusted based upon the sector return voltage. Flow than passes back to block 502. As such, the program voltage is regulated based upon feedback from the sector return voltage thereby adjusting for IR voltage losses experienced by the selected cells being programmed. Advantageously, this sector-based regulation of the program voltage effectively maintains the desired program voltage at the cells being programmed regardless of the sector being accessed for programming and/or the number of cells being programmed.

Figure 3:
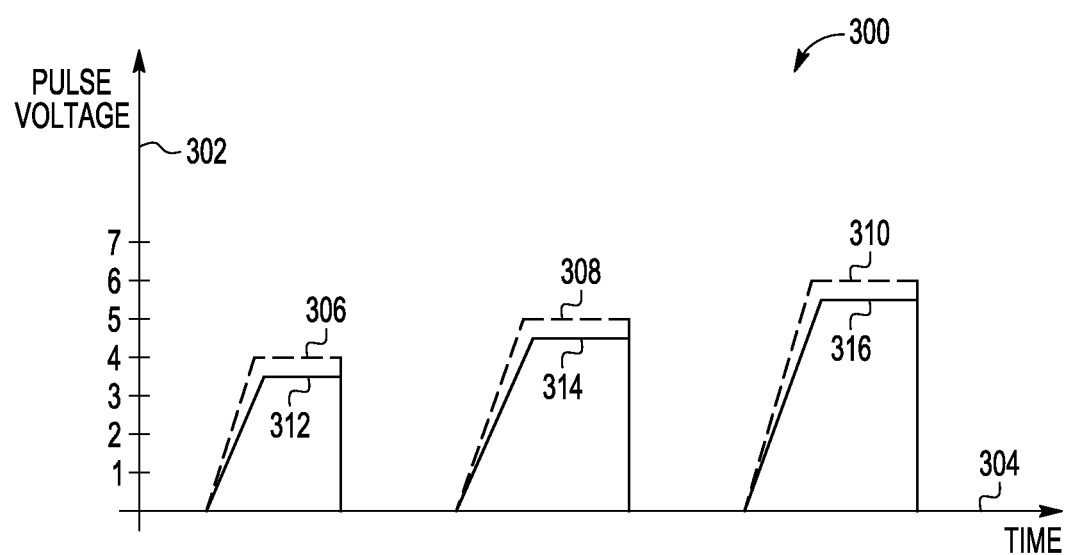
FIG. 3 (Prior Art) is a block diagram of an embodiment for variations in program pulse voltages due to IR (current-resistance) voltage losses experienced in distributing program voltages to source drivers within an NVM array.
Figure 6:
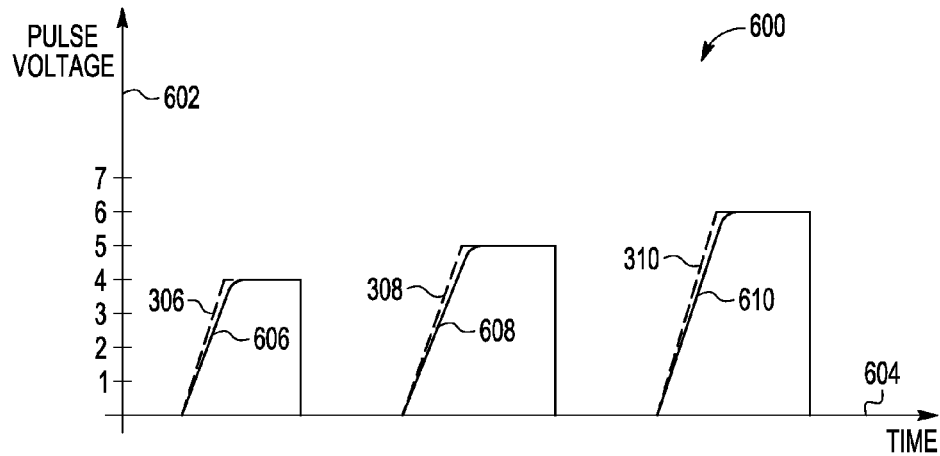
FIG. 6 is a block diagram of an embodiment for where variations in program pulse voltages due to IR voltage losses are reduced by utilizing a sector return voltage.

FIG. 6 is a block diagram of an embodiment 600 where variations in program pulse voltages due to IR voltage losses are reduced by utilizing a sector return voltage. The x-axis 604 represents time, and the y-axis 602 represents pulse voltage. As with embodiment 300 of FIG. 3 (Prior Art), three program pulses are shown for embodiment 600. Pulse voltage levels 306, 308, and 310 represent desired pulse voltage levels for pulses that ramp to 4.0 volts, 5.0 volts, and 6.0 volts, respectively. Actual voltage pulses 606, 608, and 610 initially do not reach the desired voltage levels due to IR voltage losses. However, by using a sector return voltage as feedback to adjust the program voltage generated by voltage generation circuitry, the voltage pulses 606, 608, and 610 rise to the desired voltage levels. For example, an initial IR voltage loss of about 0.1 volts can be experienced when the program voltage ($V_{PRG}$) 108 in FIG. 4 is used to drive source nodes for 72 cells at 1 milli-Amp (mA) through program voltage drivers located at the end of a voltage distribution line that is 2.2 millimeters (mm). However, the pulse voltage level adjusts to the desired pulse voltage level through regulation of the program voltage ($V_{PRG}$) 108 using the sector return voltage 408.

Figure 7:
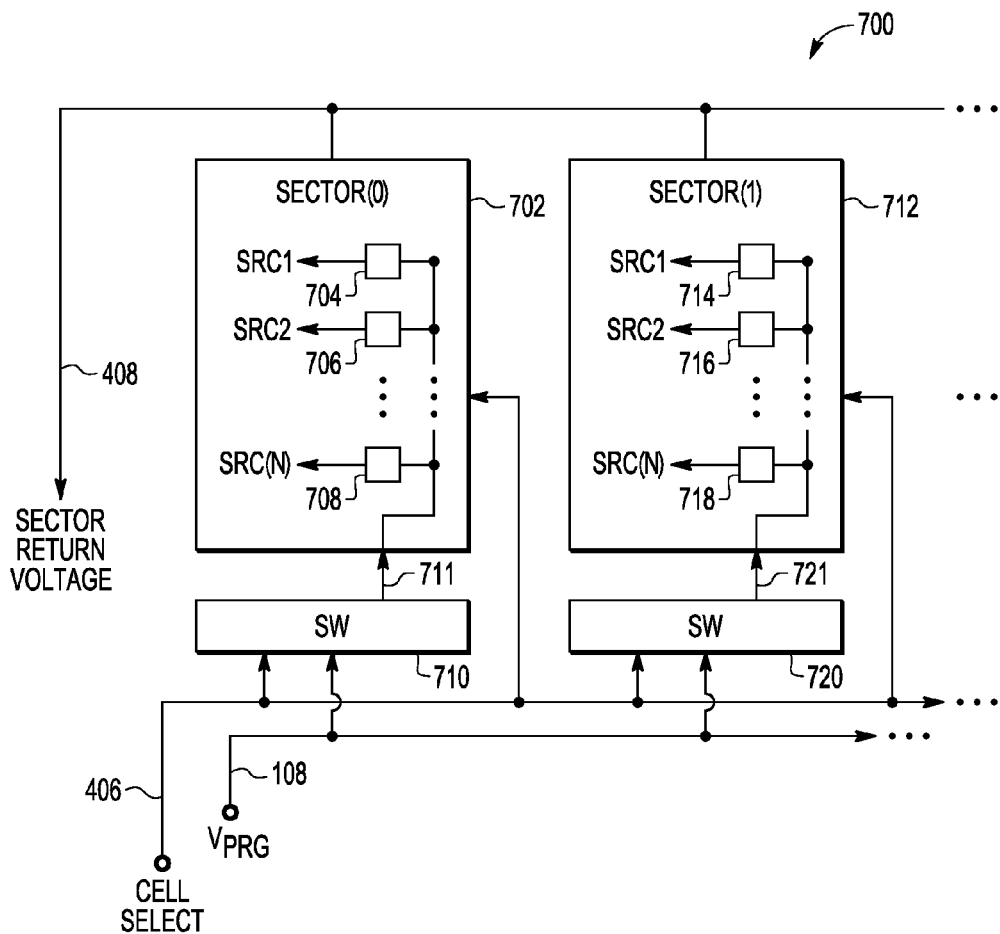
FIG. 7 is a diagram of an embodiment for a NVM system that includes multiple sectors configured to provide a sector return voltage.

FIG. 7 is a diagram of an embodiment 700 for a NVM system that includes multiple sectors 702/712 configured to provide a return sector voltage 408. For embodiment 700, the NVM cells are assumed to be split-gate NVM cells. As such, the program voltage drivers are source drivers that drive the program voltage to sources for the split-gate NVM cells. Sector(0) 702 includes an array of split-gate NVM cells and includes multiple source drivers 704, 706 . . . 708 that are coupled to drive program voltages SRC1, SRC2 . . . SRC(N) to NVM cells selected to be programmed by the cell select signal 406. Voltage switch (SW) 710 also receives the cell select signal 406 and is configured to pass the program voltage ($V_{PRG}$) 108 to sector(0) 702 along distribution line 711 if cells within sector(0) 702 are selected to be programmed. Similarly, sector(1) 712 includes an array of NVM cells and includes multiple source drivers 714, 716 . . . 718 that are coupled to drive program voltages SRC1, SRC2 . . . SRC(N) to NVM cells selected to be programmed by the cell select signal 406. Voltage switch (SW) 720 also receives the cell select signal 406 and is configured to pass the program voltage ($V_{PRG}$) 108 to sector(1) 712 along distribution line 721 if cells within sector(1) 712 are selected to be programmed. Other sectors can be similarly configured. As described herein, each sector, such as sector(0) 702 and sector(1) 712, are further configured to output a sector return voltage 408 if cells within the sector are being programmed. As indicated above, the return distribution line for the sector return voltage 408 can be configured as a high impedance load so that IR drops for this sector return voltage 408 do not adversely impact the voltage feedback signal ($V_{FB}$) 116 provided to the voltage pump circuitry 102.

Figure 8:
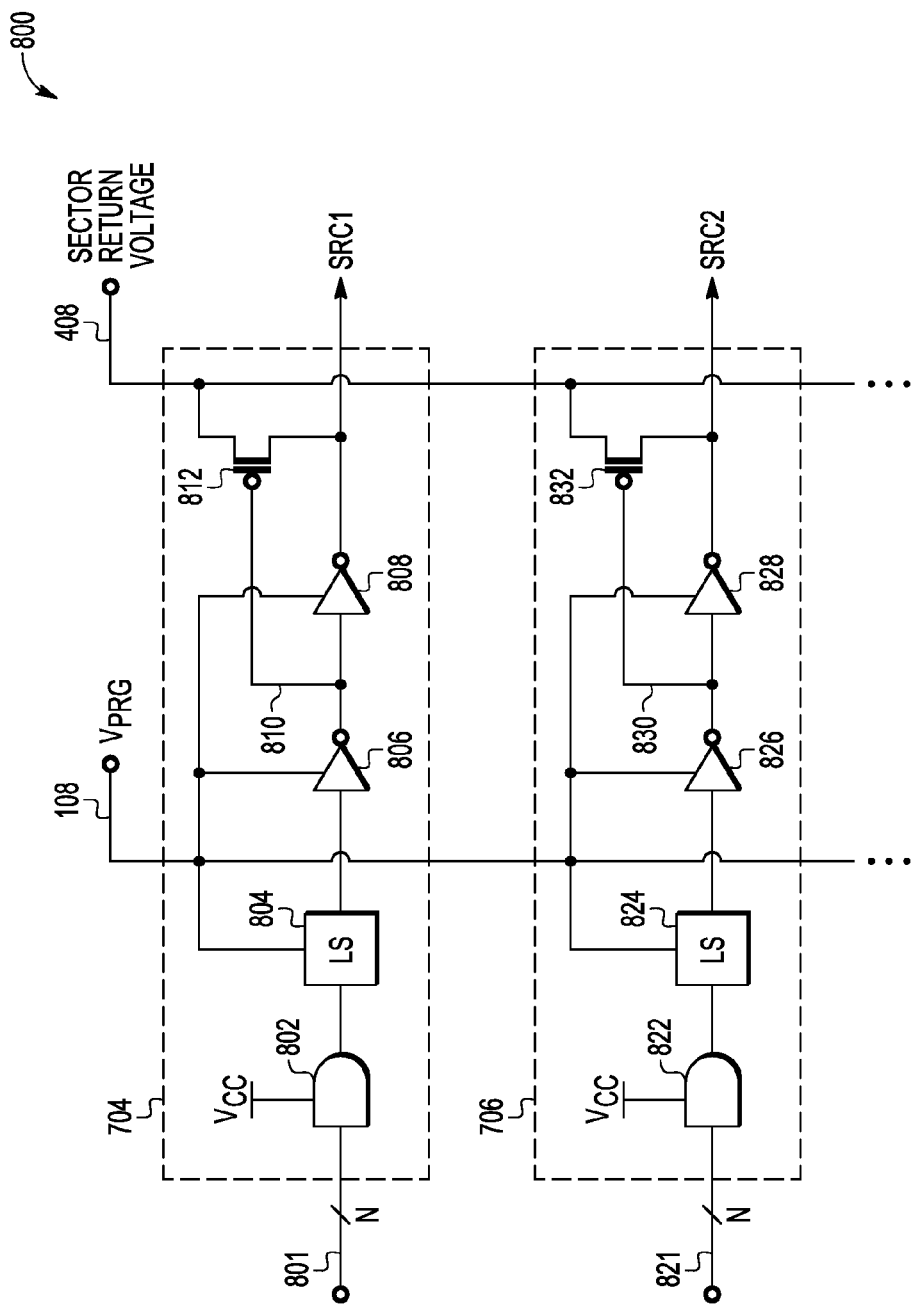
FIG. 8 is a circuit diagram of an embodiment for source driver circuitry that can be utilized for the source drivers in FIG. 7.

FIG. 8 is a circuit diagram of an embodiment 800 for source driver circuitry that can be utilized for the source drivers in FIG. 7. Embodiment 800 includes circuit details for source drivers 704 and 706 within sector(0) of embodiment 700. The other source drivers within sector(0) and/or within the other sectors for the NVM array can be similarly configured. Further, it is noted that the pass devices 812/832 allow for the program voltage being driven to the NVM cells to be output to the distribution line for the sector return voltage 408. The pass devices 812/832 are implemented as PMOS (p-type metal-oxide-semiconductor) transistors for embodiment 800, although other pass device circuitry could also be utilized. Further, although it is assumed for embodiment 800 that split-gate NVM cells are being used, other NVM cells could also be utilized while still providing pass devices to output the sector program voltages to a distribution line for the sector return voltage 408.

Looking back to FIG. 8, it is seen that source drivers 704/706 include logic circuitry that operates to determine when the source driver is active. In particular, source driver 704 includes an AND gate 802 that is configured to receive an N-bit decoded selection signal 801 that is based upon the cell select signal 406 and that determines whether or not the source driver 704 is activated. Similarly, source driver 706 includes an AND gate 822 that is configured to receive an N-bit decoded selection signal 821 that is based upon the cell select signal 406 and that determines whether or not the source driver 706 is activated. Other source drivers can be similarly configured, and the decoded input signals determine which of the source drivers are activated. It is further noted that different logic and/or activation circuitry could also be utilized rather than the AND gate embodiment shown for embodiment 800.

Source driver 704 is activated if all inputs for the N-bit decoded selection signal 801 are at a high logic level. When the source driver 704 is activated, the AND gate 802 passes a high logic level at the digital supply voltage (Vcc) to the level shifter (LS) 804. The level shifter (LS) 804 then shifts the Vcc voltage level output from AND gate 802 to the program voltage ($V_{PRG}$) level and provides this higher voltage output signal to the inverter 806. The inverter 806 in turn inverts this voltage level and provides a low voltage level (e.g., ground) to inverter 808. This low voltage level is also provided as control signal 810 to the gate of PMOS transistor 812. Inverter 808 inverts the low voltage level and provides an output signal at the program voltage ($V_{PRG}$) level that serves as the output program voltage (SRC1) for the source driver 704. The gate of PMOS transistor 812 receives the low voltage level from inverter 806 as control signal 810, thereby turning "on" the PMOS transistor 812. The PMOS transistor 812 then operates as a pass device that passes the voltage level for the output program voltage (SRC1) to the distribution line for the sector return voltage 408. Any IR voltage drop present on the program voltage ($V_{PRG}$) 108, which is used to power the source driver output (SRC1), will also be passed on to the sector return voltage 408.

Similarly, source driver 706 is activated if all inputs for the N-bit decoded selection signal 821 are at a high logic level. When the source driver 706 is activated, the AND gate 822 passes a high logic level at the digital supply voltage (Vcc) to the level shifter (LS) 824. The level shifter (LS) 824 then shifts the Vcc voltage level output from AND gate 822 to the program voltage ($V_{PRG}$) level and provides this higher voltage output signal to the inverter 826. The inverter 826 in turn inverts this voltage level and provides a low voltage level (e.g., ground) to inverter 828. This low voltage level is also provided as control signal 830 to the gate of PMOS transistor 832. Inverter 828 inverts the low voltage level and provides an output signal at the program voltage ($V_{PRG}$) level that serves as the output program voltage (SRC1) for the source driver 706. The gate of PMOS transistor 832 receives the low voltage level from inverter 826 as control signal 830, thereby turning "on" the PMOS transistor 832. The PMOS transistor 832 then operates as a pass device that passes the voltage level for the source driver output voltage (SRC1) to the distribution line for the sector return voltage 408. As with source driver 706, any IR voltage drop present on the program voltage ($V_{PRG}$) 108, which is used to power the source driver output (SRC1), will also be passed on to the sector return voltage 408.

By adding the pass devices 812/832 to the parallel source drivers 704/706 and activating the pass device 812/832 for the active source driver, the disclosed embodiments are able to provide a sector return voltage 408 that allows for the program voltage ($V_{PRG}$) 108 to be adjusted to account for IR voltage drops at the source driver boundary regardless of the distribution distance or the number of cells to be programmed. It is noted that if multiple source drivers are selected in embodiment 800, then each of the source driver output signals will be passed on to the distribution line for the sector return voltage 408. As these source driver outputs are all being driven from the program voltage ($V_{PRG}$) 108, this common connection does not generate a problem. As indicated above, additional and/or different logic circuitry could also be utilized in addition to and/or instead of the AND gates shown in FIG. 8, while still providing an activation signal to the rest of the source driver circuitry. Further, it is noted that although ground connections are not shown, it is understood that the circuit blocks 802, 804, 806, 808, 822, 824, 826, and 828 would also be connected to ground.

Figure 9:
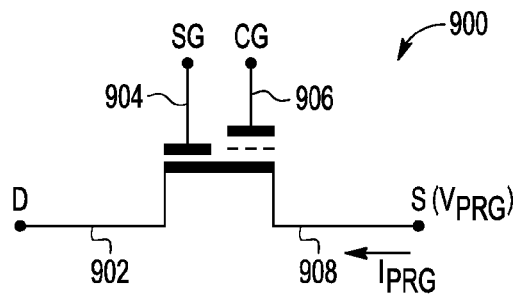
FIG. 9 is a diagram of an embodiment for a split-gate NVM cell that could be used for the NVM arrays described herein.

FIG. 9 is a diagram of an embodiment 900 for a split-gate NVM cell that could be used for the NVM arrays described herein. The NVM cell includes a drain (D) 902, which provides the bit line data connection for the NVM cell. The NVM cell also includes a select gate (SG) 904 and a control gate (CG) 906 that is positioned above a charge storage layer. The NVM cell further includes a source (S) 908. The source (S) 908 is driven with the program voltage ($V_{PRG}$) and a program current ($I_{PRG}$) when the split-gate NVM cell is being programmed.

Figure 10:
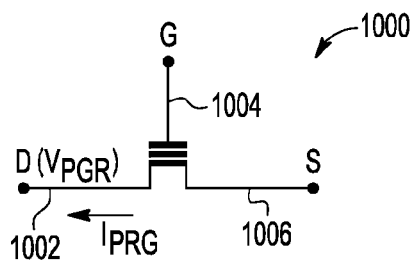
FIG. 10 is a diagram of an embodiment for a floating gate NVM cell that could be used for the NVM arrays described herein.

FIG. 10 is a diagram of an embodiment 1000 for a floating gate NVM cell that could be used for the NVM arrays described herein. The NVM cell includes a drain (D) 1002, which provides the bit line data connection for the NVM cell. The NVM cell also includes a gate (G) 1004 that is positioned above a floating gate. The NVM cell further includes a source (S) 1006. The drain (D) 1002 is driven with the program voltage ($V_{PRG}$) and a program current ($I_{PRG}$) when the floating-gate NVM cell is being programmed.

Figure 11:
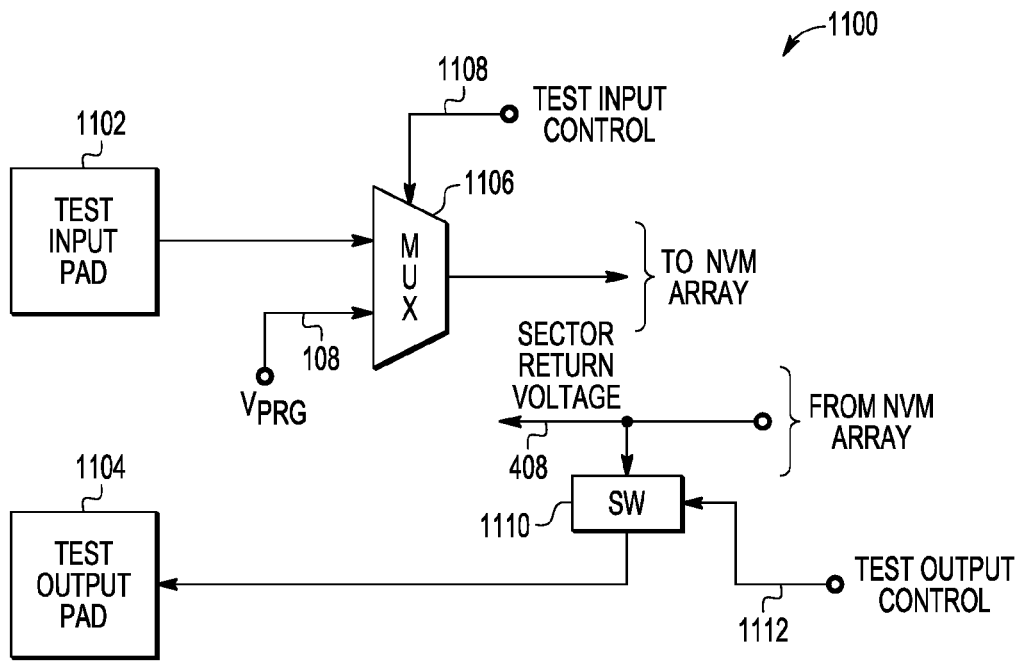
FIG. 11. is a block diagram of an embodiment for test mode operations associated with the use of a sector return voltage as described herein.

FIG. 11. is a block diagram of an embodiment 1100 for test mode operations associated with the use of a sector return voltage 408 as described herein. A test input pad 1102 is coupled to a multiplexer (MUX) 1106, which is also configured to receive the regulated program voltage ($V_{PRG}$) 108. A test input control signal 1108 is provided to the multiplexer 1106 and determines which input is provided to the NVM array as the program voltage. The sector return voltage 408 from the NVM array is coupled to a switch (SW) 1110. The switch receives a test output control signal 1112 that determines whether or not the sector return voltage 408 is provided to the test output pad 1104. During test operations, the test input pad 1102 can be used to provide test program voltages to the array, and the test output pad 1104 can be used to monitor the sector return voltage 408. The test input pad 1102 and the test output pad 1104 can be separately enabled and disabled, as desired, such that they can be both enabled at the same time, both disabled at the same time, or one enabled and one disabled.

As described herein, a variety of embodiments can be implemented and different features and variations can be implemented, as desired.

For one embodiment, a non-volatile memory (NVM) system is disclosed including an array of NVM cells organized in a plurality of sectors, a plurality of program voltage drivers within each sector coupled to drive program nodes within the NVM cells where the program voltage drivers are configured to output a sector return voltage when active, voltage generation circuitry configured to output a program voltage to the plurality of program voltage drivers where the program voltage are dependent upon a feedback signal, and feedback circuitry coupled to receive the sector return voltage and to provide the feedback signal to the voltage generation circuitry.

In other embodiments, the system further includes a program voltage distribution line configured to distribute the program voltage to the program voltage drivers and a return distribution line configured to distribute the sector return voltage back to the feedback circuitry. In addition, the program voltage distribution line can be configured to provide a low impedance load, and wherein the return distribution line can be configured to provide a high impedance load.

In further embodiments, the feedback circuitry includes a comparator configured to compare an input voltage with a reference voltage. In addition, the feedback circuitry can further include a multiplexer configured to receive as inputs the program voltage from the voltage generation circuitry and the sector return voltage and configured to selectively provide one of these inputs to the comparator based upon a feedback control signal.

In still further embodiments, the program voltage drivers can each include pass device circuitry coupled between a return distribution line for the sector return voltage and an output voltage node for the program voltage driver. In addition, the pass device circuitry can include a PMOS transistor, and each of the program voltage drivers can include an inverter having its output coupled to a second inverter and to a gate of the PMOS transistor where the output of the second inverter is coupled to the output voltage node for the program voltage driver. Further, the system can include a cell select signal coupled to the sectors and configured to determine NVM cells to be programmed. Still further, the NVM cells can include at least one of split-gate NVM cells or floating gate NVM cells.

For additional embodiments, the system can further include a test input pad coupled to selectively provide an external input voltage as the program voltage. In addition, the system can further include a test output pad coupled to selectively receive the sector return voltage.

For one embodiment, a method for a non-volatile memory (NVM) system is disclosed including generating a program voltage dependent upon a feedback signal, selecting NVM cells to be programmed where the NVM cells are within an array of NVM cells organized in a plurality of sectors, distributing the program voltage to one or more program voltage drivers associated with the NVM cells to be programmed where the program voltage drivers are located within sectors for the NVM cells to be programmed, applying at least one sector program voltage to the NVM cells to be programmed using the program voltage drivers, and utilizing a sector return voltage associated with the sector program voltage to provide the feedback signal for the generating step.

In other embodiments, the distributing step can include using a low impedance distribution line to distribute the program voltage, and the utilizing step can include using a high impedance return distribution line to return the sector return voltage for use as the feedback signal.

In further embodiments, the utilizing step can include comparing in input voltage to a reference voltage to generate the feedback signal. In addition, the method can include selectively providing either the program voltage or the sector return voltage as the input voltage for the comparing step. Further, the program voltage can be initially provided as the input voltage, and the sector return voltage can be subsequently provided as the input voltage.

In still further embodiments, the method can include generating the sector return voltage by a passing an output voltage from at least one program voltage driver to a return distribution line for the sector return voltage. In addition, the NVM cells can be at least one of split-gate NVM cells or floating gate NVM cells.

For additional embodiments, the method can include selectively providing an external input voltage from a test input pad as the program voltage. In addition, the method can include selectively providing the sector return voltage to a test output pad.

It is noted that the functional blocks described herein can be implemented using hardware, software, or a combination of hardware and software, as desired. In addition, one or more processors or processing circuitry running software and/or firmware can also be used, as desired, to implement the disclosed embodiments. It is further understood that one or more of the operations, tasks, functions, or methodologies described herein may be implemented, for example, as software or firmware and/or other program instructions that are embodied in one or more non-transitory tangible computer readable mediums (e.g., memory) and that are executed by one or more controllers, microcontrollers, microprocessors, hardware accelerators, and/or other processors or processing circuitry to perform the operations and functions described herein.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. A non-volatile memory (NVM) system, comprising:
an array of NVM cells organized in a plurality of sectors;
a plurality of program voltage drivers within each sector coupled to drive program nodes within the NVM cells, the program voltage drivers being configured to output a sector return voltage when active;
voltage generation circuitry configured to output a program voltage to the plurality of program voltage drivers, the program voltage being dependent upon a feedback signal; and
feedback circuitry coupled to receive the sector return voltage and to provide the feedback signal to the voltage generation circuitry.

2. The NVM system of claim 1, further comprising a program voltage distribution line configured to distribute the program voltage to the program voltage drivers, and a return distribution line configured to distribute the sector return voltage back to the feedback circuitry.

3. The NVM system of claim 2, wherein the program voltage distribution line is configured to provide a low impedance load, and wherein the return distribution line is configured to provide a high impedance load.

4. The NVM system of claim 1, wherein the feedback circuitry comprises a comparator configured to compare an input voltage with a reference voltage.

5. The NVM system of claim 4, wherein the feedback circuitry further comprises a multiplexer configured to receive as inputs the program voltage from the voltage generation circuitry and the sector return voltage and to selectively provide one of these inputs to the comparator based upon a feedback control signal.

6. The NVM system of claim 1, wherein the program voltage drivers each comprise pass device circuitry coupled between a return distribution line for the sector return voltage and an output voltage node for the program voltage driver.

7. The NVM system of claim 6, wherein the pass device circuitry comprises a PMOS transistor, and wherein each of the program voltage drivers comprises an inverter having its output coupled to a second inverter and to a gate of the PMOS transistor, the output of the second inverter being coupled to the output voltage node for the program voltage driver.

8. The NVM system of claim 1, further comprising a cell select signal coupled to the sectors and configured to determine NVM cells to be programmed.

9. The NVM system of claim 1, wherein the NVM cells comprise at least one of split-gate NVM cells or floating gate NVM cells.

10. The NVM system of claim 1, further comprising a test input pad coupled to selectively provide an external input voltage as the program voltage.

11. The NVM system of claim 1, further comprising a test output pad coupled to selectively receive the sector return voltage.

12. A method for a non-volatile memory (NVM) system, comprising:
generating a program voltage dependent upon a feedback signal;
selecting NVM cells to be programmed, the NVM cells being within an array of NVM cells organized in a plurality of sectors;
distributing the program voltage to one or more program voltage drivers associated with the NVM cells to be programmed, the program voltage drivers being located within sectors for the NVM cells to be programmed;
applying at least one sector program voltage to the NVM cells to be programmed using the program voltage drivers; and
utilizing a sector return voltage associated with the sector program voltage to provide the feedback signal for the generating step.

13. The method of claim 12, wherein the distributing step comprises using a low impedance distribution line to distribute the program voltage, and wherein the utilizing step comprises using a high impedance return distribution line to return the sector return voltage for use as the feedback signal.

14. The method of claim 12, wherein the utilizing step comprises comparing an input voltage to a reference voltage to generate the feedback signal.

15. The method of claim 14, further comprising selectively providing either the program voltage or the sector return voltage as the input voltage for the comparing step.

16. The method of claim 15, wherein the program voltage is initially provided as the input voltage and the sector return voltage is subsequently provided as the input voltage.

17. The method of claim 12, further comprising generating the sector return voltage by a passing an output voltage from at least one program voltage driver to a return distribution line for the sector return voltage.

18. The method of claim 12, wherein the NVM cells comprise at least one of split-gate NVM cells or floating gate NVM cells.

19. The method of claim 12, further comprising selectively providing an external input voltage from a test input pad as the program voltage.

20. The method of claim 12, further comprising selectively providing the sector return voltage to a test output pad.

* * * * *